(12) United States Patent
Shih et al.

(10) Patent No.: US 10,854,734 B1
(45) Date of Patent: Dec. 1, 2020

(54) MANUFACTURING METHOD OF SEMICONDUCTOR DEVICE

(71) Applicant: GLC SEMICONDUCTOR GROUP (CQ) CO., LTD., Chongqing (CN)

(72) Inventors: Yi-Chun Shih, Nantou County (TW); Shun-Min Yeh, Hsinchu (TW)

(73) Assignee: GLC SEMICONDUCTOR GROUP (CQ) CO., LTD., Chongqing (CN)

( * ) Notice: Subject to any disclaimer, the term of this patent is extended or adjusted under 35 U.S.C. 154(b) by 0 days.

(21) Appl. No.: 16/521,585

(22) Filed: Jul. 24, 2019

(30) Foreign Application Priority Data

May 28, 2019 (TW) .............................. 108118339 A
May 28, 2019 (TW) .............................. 108118357 A

(51) Int. Cl.
| H01L 21/00 | (2006.01) |
| H01L 29/00 | (2006.01) |
| H01L 29/66 | (2006.01) |
| H01L 29/417 | (2006.01) |
| H01L 29/08 | (2006.01) |
| H01L 29/40 | (2006.01) |
| H01L 21/02 | (2006.01) |

(52) U.S. Cl.
CPC .. *H01L 29/66712* (2013.01); *H01L 21/02505* (2013.01); *H01L 29/0882* (2013.01); *H01L 29/401* (2013.01); *H01L 29/41741* (2013.01); *H01L 29/66522* (2013.01)

(58) Field of Classification Search
CPC ..... H01L 21/832821; H01L 21/823814; H01L 21/76224; H01L 21/76898; H01L 21/02505; H01L 29/66712; H01L 29/0882; H01L 29/401; H01L 29/41741; H01L 29/66522
See application file for complete search history.

(56) References Cited

U.S. PATENT DOCUMENTS 8,487,375 B2 * 7/2013 Okamoto .......... H01L 21/76898
257/194
2011/0115025 A1 * 5/2011 Okamoto ............ H01L 29/4175
257/368

FOREIGN PATENT DOCUMENTS

CN 101079441 A 11/2007
CN 105283959 A 1/2016

* cited by examiner

*Primary Examiner* — Nikolay K Yushin
(74) *Attorney, Agent, or Firm* — Winston Hsu

(57) ABSTRACT

A manufacturing method of a semiconductor device includes the following steps. A substrate is provided. The substrate has a first side and a second side opposite to the first side. A first III-V compound layer is formed at the first side of the substrate. A drain trench and a contact trench are formed at the second side of the substrate. The drain trench extends from the second side of the substrate toward the first side of the substrate and penetrates the substrate. The contact trench extends from the second side of the substrate toward the first side of the substrate and penetrates the substrate. The drain trench and the contact trench are formed concurrently by the same process. A drain electrode is formed in the drain trench. A back contact structure is formed in the contact trench.

18 Claims, 12 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including a drain trench and a contact trench.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In recent years, gallium nitride (GaN) based materials have been applied in the high power and high frequency products because of the properties of wider band-gap and high saturation velocity. Two-dimensional electron gas (2DEG) may be generated by the piezoelectricity property of the GaN-based materials, and the switching velocity may be enhanced because of the higher electron velocity and the higher electron density of the 2DEG. However, with demands for higher performance of the related semiconductor devices, the structural design and/or the process design have to be modified continuously for improving the distribution density of the transistors and/or the electrical performance of the transistor and satisfying the product specifications.

SUMMARY OF THE INVENTION

It is one of the objectives of the present invention to provide a manufacturing method of a semiconductor device. A drain trench and a contact trench are formed at a back side of a substrate, and a drain electrode and a back contact structure are formed in the drain trench and the contact trench respectively for enhancing a distribution density of transistors and/or simplifying related wiring layout design and related processes. In addition, the drain trench and the contact trench may be formed concurrently by the same process, and the purpose of process simplification may be achieved accordingly.

A manufacturing method of a semiconductor device is provided in an embodiment of the present invention. The manufacturing method includes the following steps. Firstly, a substrate is provided. The substrate has a first side and a second side opposite to the first side. A first III-V compound layer is formed at the first side of the substrate. A drain trench and a contact trench are formed at the second side of the substrate. The drain trench extends from the second side of the substrate toward the first side of the substrate and penetrates the substrate. The contact trench extends from the second side of the substrate toward the first side of the substrate and penetrates the substrate. The drain trench and the contact trench are formed concurrently by the same process. A drain electrode is formed in the drain trench. A back contact structure is formed in the contact trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-9 are schematic drawings illustrating a manufacturing method of a semiconductor device according to a second embodiment of the present invention, wherein FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

Figure 1:
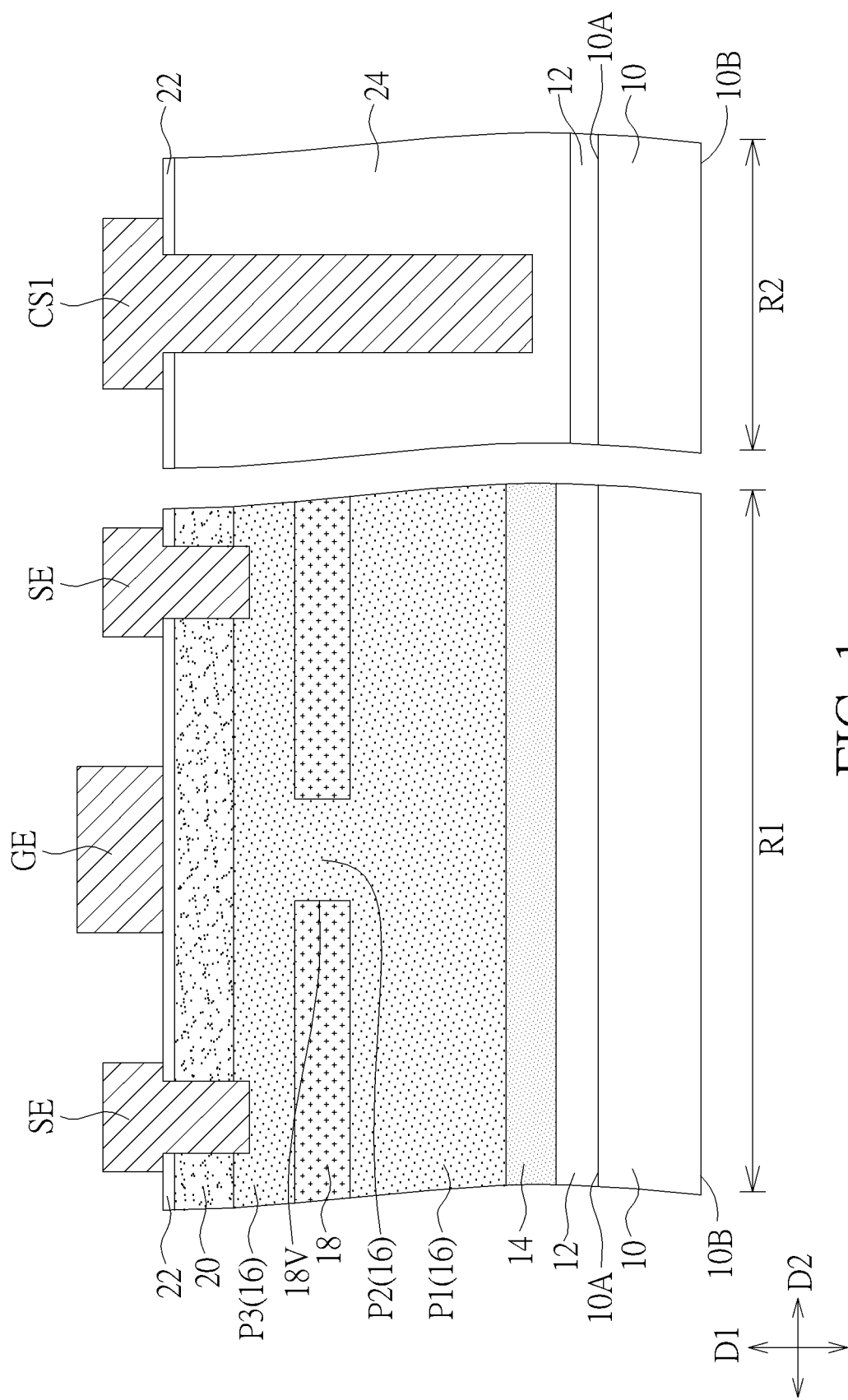
Figure 2:
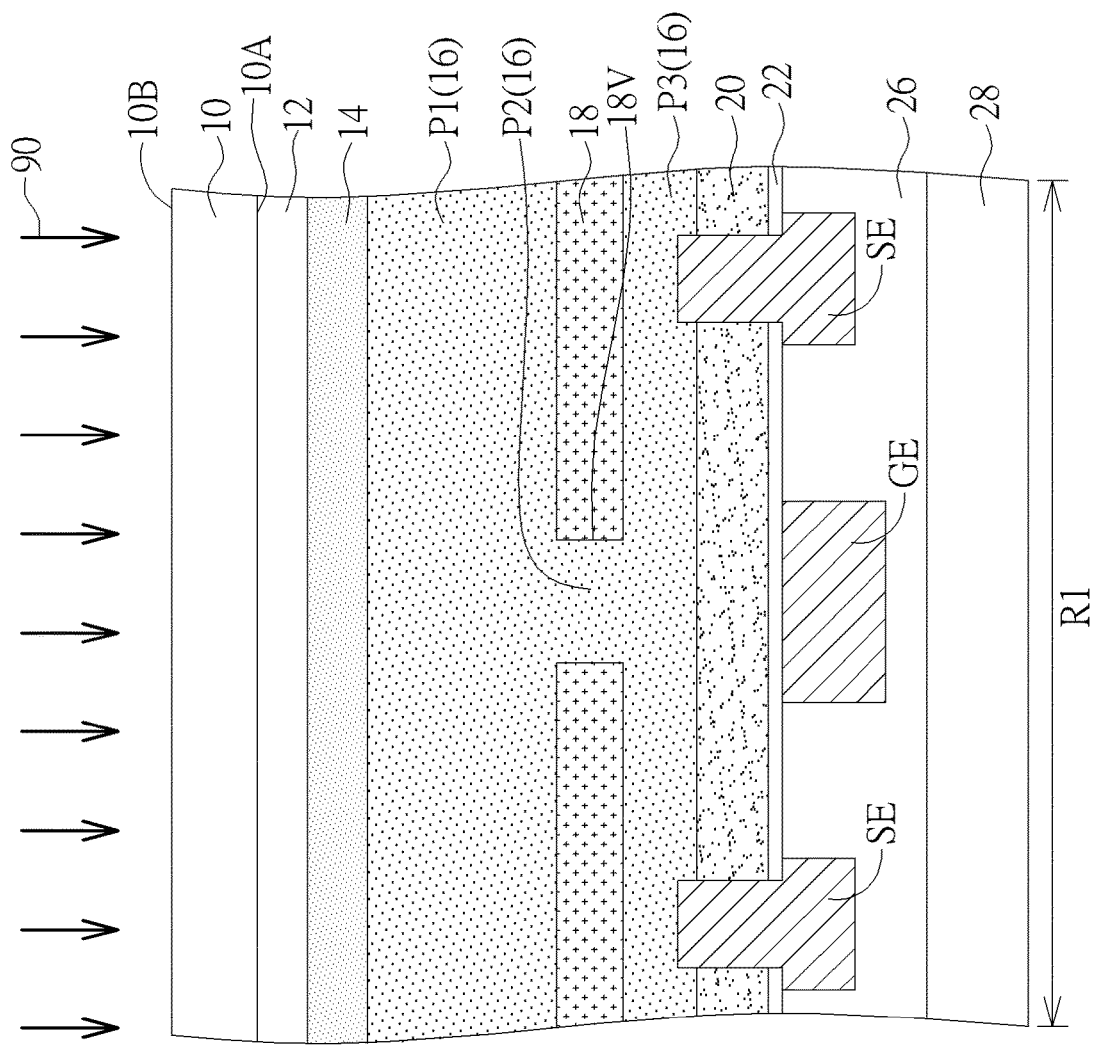
Figure 2:
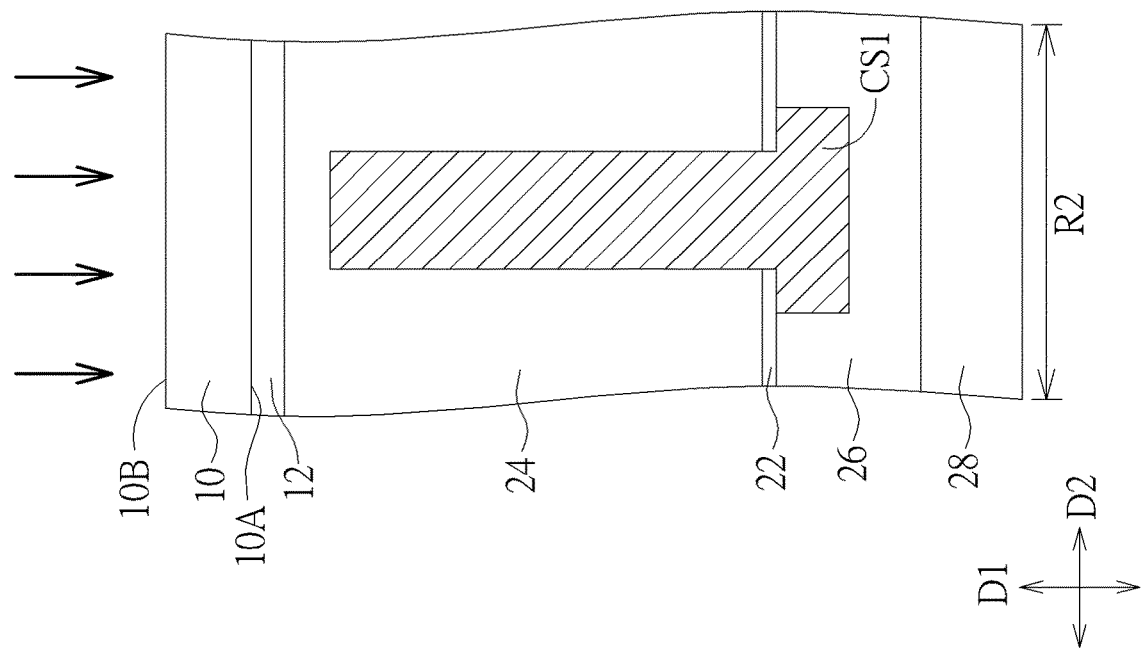
Figure 3:
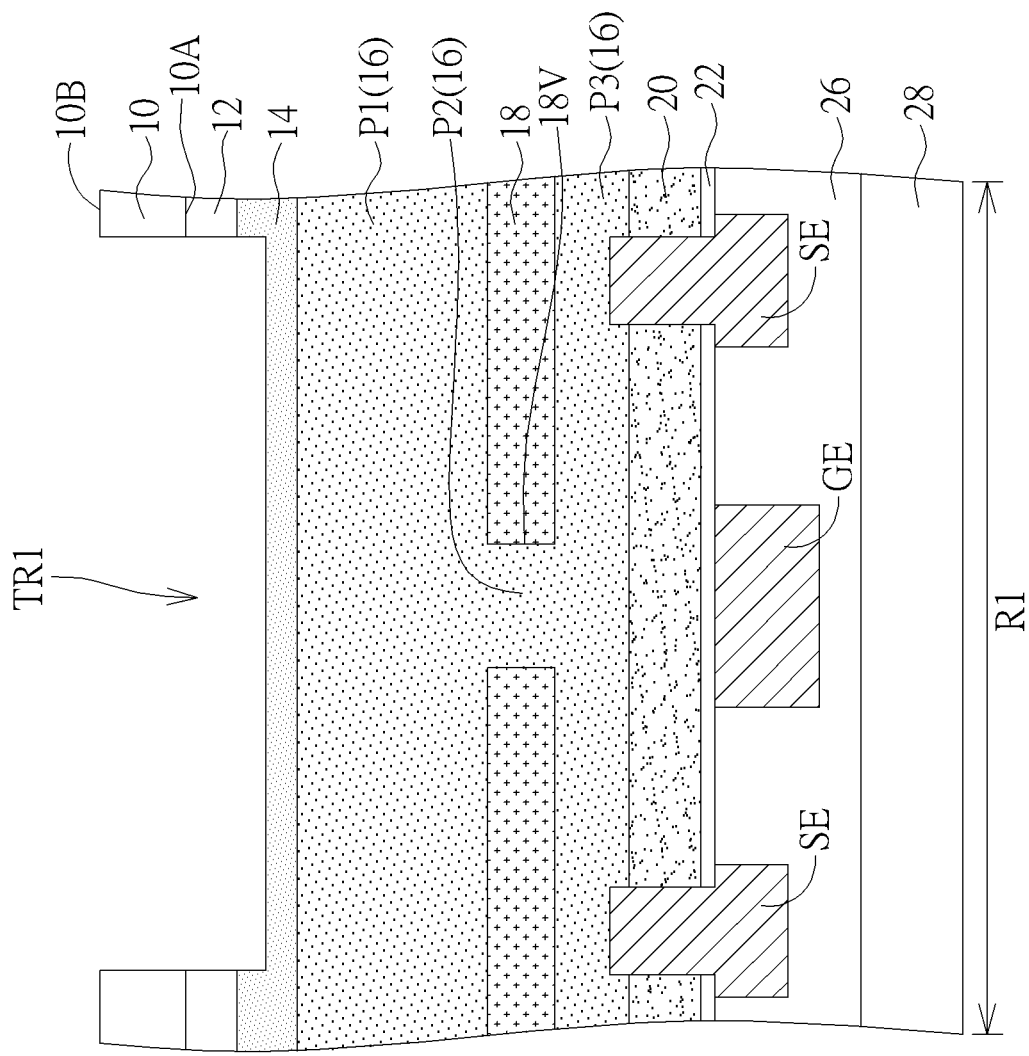
Figure 4:
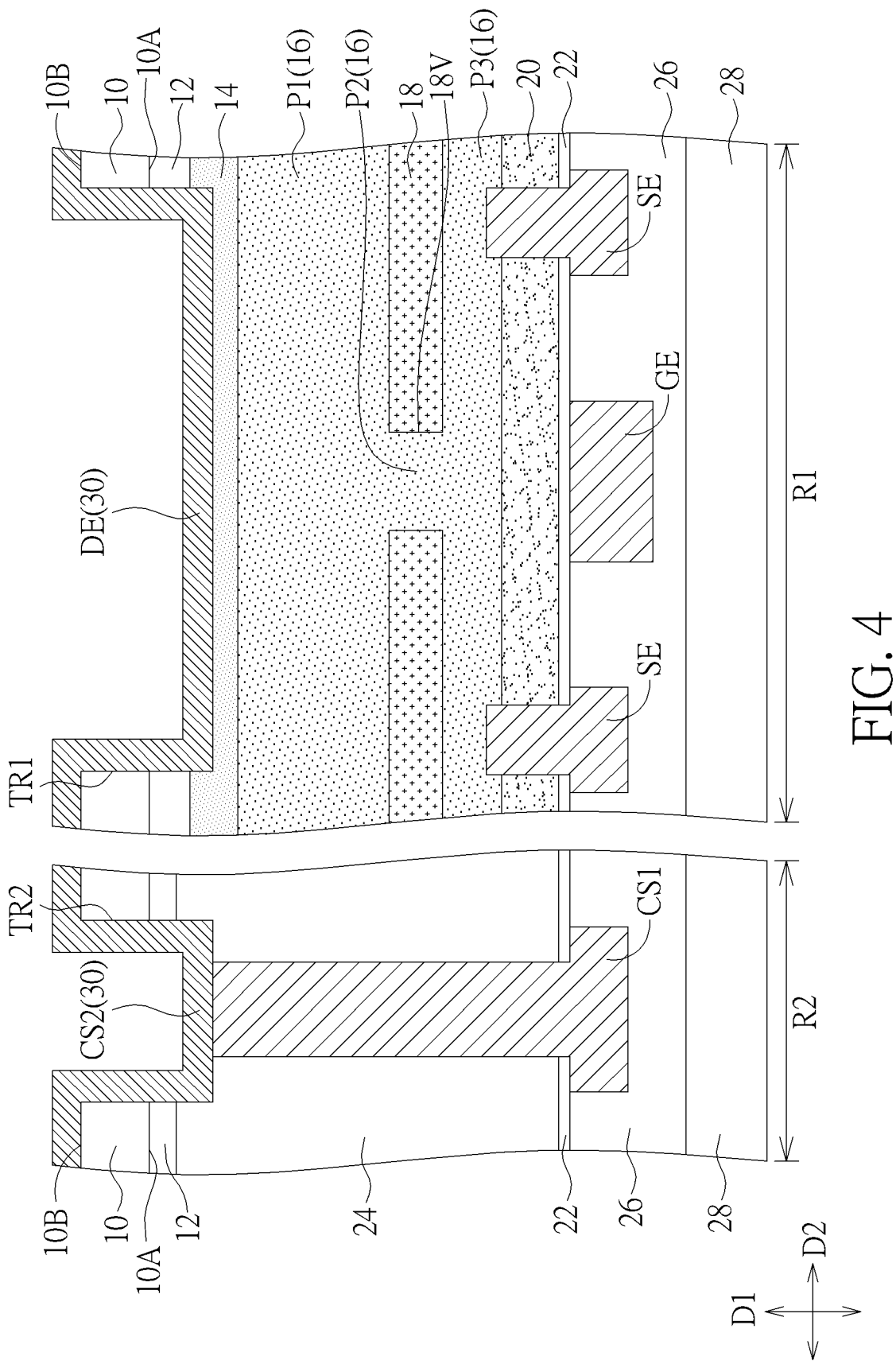
Figure 5:
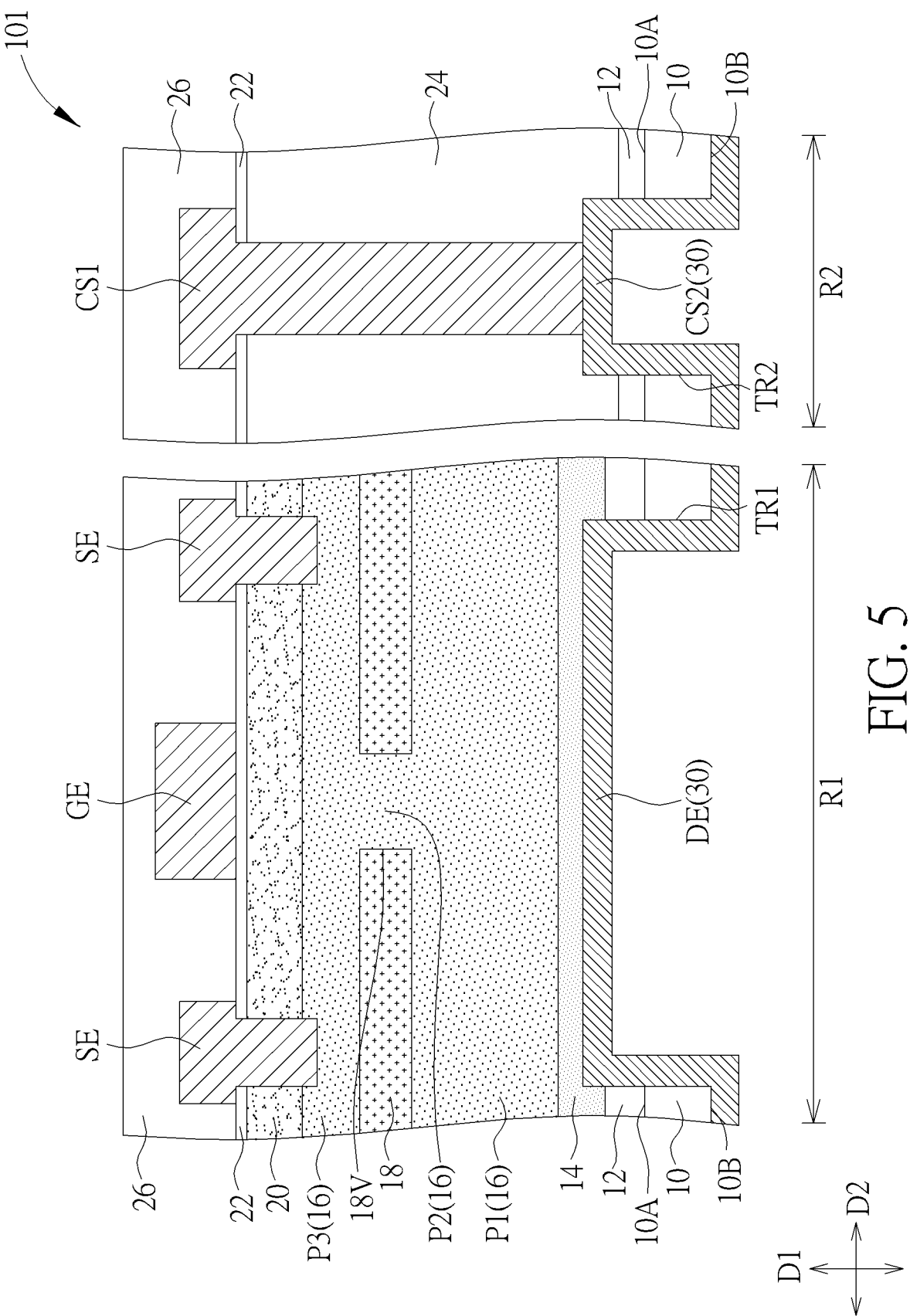

Please refer to FIGS. 1-5. FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. As shown in FIG. 5, a manufacturing method of a semiconductor device is provided in this embodiment and includes the following steps. Firstly, a substrate 10 is provided. The substrate 10 has a first side 10A and a second side 10B. The first side 10A and the second side 10B may be regarded as two opposite sides of the substrate 10 in a thickness direction of the substrate 10 (such as a first direction D1 shown in FIG. 5), but not limited thereto. Subsequently, a first III-V compound layer 16 is formed at the first side 10A of the substrate 10, and a drain trench TR1 and a contact trench TR2 are formed at the second side 10B of the substrate 10. The drain trench TR1 may extend from the second side 10B of the substrate 10 toward the first side 10A of the substrate 10 and penetrates the substrate 10. The contact trench TR2 may extend from the second side 10B of the substrate 10 toward the first side 10A of the substrate 10 and penetrates the substrate 10. The drain trench TR1 and the contact trench TR2 may be formed concurrently by the same process. A drain electrode DE is formed in the drain trench TR1, and a back contact structure CS2 is formed in the contact trench TR2.

Specifically, the manufacturing method of the semiconductor device 101 in this embodiment may include but is not limited to the following steps. As shown in FIG. 1, the first III-V compound layer 16 may be formed at the first side 10A of the substrate 10. In some embodiments, the substrate 10 may include a silicon substrate, a silicon carbide (SiC) substrate, a sapphire substrate, and the first III-V compound layer 16 may include gallium nitride (GaN), indium gallium nitride (InGaN), and/or other suitable III-V compound semiconductor materials. In some embodiments, a buffer layer 12 may be formed at the first side 10A of the substrate 10, and a second III-V compound layer 14 may be formed on the buffer layer 12 before the step of forming the first III-V compound layer 16, but not limited thereto. At least a part of the buffer layer 12 may be located between the first III-V compound layer 16 and the substrate 10 in the first direction D1, and the second III-V compound layer 14 may be located between the first III-V compound layer 16 and the buffer layer 12 in the first direction D1. The buffer layer 12 may include a buffer material beneficial for forming a III-V compound layer on the substrate 10 by an epitaxial growth approach. Therefore, the buffer layer 12 may include gallium nitride, aluminum gallium nitride (AlGaN), or other suitable buffer materials. The second III-V compound layer 14 may include gallium nitride, indium gallium nitride, and/or other suitable III-V compound semiconductor materials. In some embodiments, the first III-V compound layer 16 and the second III-V compound layer 14 may be the same III-V compound material with different doping concentrations.

For example, the first III-V compound layer 16 may include an n-type lightly doped gallium nitride layer, and the second III-V compound layer 14 may include an n-type heavily doped gallium nitride layer, but not limited thereto. The n-type dopant may include silicon, germanium, or other suitable dopants. Additionally, in some embodiments, a nitride layer 20 may be formed on the first III-V compound layer 16. The nitride layer 20 may be used as a barrier layer or a capping layer in a semiconductor device. The nitride layer 20 may be formed by materials such as aluminum gallium nitride, aluminum indium nitride (AlInN), and/or aluminum nitride (AlN) when the nitride layer 20 is used as a barrier layer, and the nitride layer 20 may be formed by materials such as aluminum gallium nitride, aluminum nitride, gallium nitride, and/or silicon nitride when the nitride layer 20 is used as a capping layer, but not limited thereto.

In some embodiments, the manufacturing method may further include forming a third III-V compound layer 18 at the first side 10A of the substrate 10, and at least a part of the first III-V compound layer 16 may be located between the third III-V compound layer 18 and the second III-V compound layer 14 in the first direction D1. In some embodiments, the third III-V compound layer 18 may be located in the first III-V compound layer 16, and the third III-V compound layer 18 may have an opening 18V. In this configuration, a first portion P1 of the first III-V compound layer 16 may be located between the third III-V compound layer 18 and the second III-V compound layer 14, a second portion P2 of the first III-V compound layer 16 may be located in the opening 18V, and a third portion P3 of the first III-V compound layer 16 may be located between the nitride layer 20 and the third III-V compound layer 18, but not limited thereto.

In some embodiments, the third III-V compound layer 18 and the second III-V compound layer 14 may be the same III-V compound material with different doping types. For example, the second III-V compound layer 14 may include an n-type heavily doped gallium nitride layer, the third III-V compound layer 18 may include a p-type doped gallium nitride layer, the first portion P1 of the first III-V compound layer 16 may include an n-type lightly doped gallium nitride layer, the second portion P2 of the first III-V compound layer 16 may include an n-type doped gallium nitride layer, and the third portion P3 of the first III-V compound layer 16 may include an unintentionally doped (UID) gallium nitride layer, but not limited thereto. The p-type dopant may include magnesium or other suitable dopants. In some embodiments, the third III-V compound layer 18 may include a III-V compound material different from the second III-V compound layer 14. It is worth noting that the buffer layer 12, the second III-V compound layer 14, the first III-V compound layer 16, the third III-V compound layer 18, and the nitride layer 20 described above may be formed at the first side 10A of the substrate 10 by using suitable dopants in epitaxial processes, but the present invention is not limited to this. In some embodiments, the material layers describe above may also be formed by other suitable film-forming approaches according to some considerations.

In some embodiments, a first region R1 and a second region R2 may be defined on the substrate 10. In some embodiments, the buffer layer 12, the second III-V compound layer 14, the first III-V compound layer 16, the third III-V compound layer 18, and/or the nitride layer 20 described above may be formed on the first region R1 and the second region R2. Subsequently, a part of the buffer layer 12, a part of the second III-V compound layer 14, a part of the first III-V compound layer 16, a part of the third III-V compound layer 18, and/or a part of the nitride layer 20 may be removed (such as removing the nitride layer 20, the first III-V compound layer 16, the third III-V compound layer 18, the second III-V compound layer 14, and a part of the buffer layer 12 on the second region R2) for forming a mesa structure on the first region R1, and the mesa structure may include the buffer layer 12, the second III-V compound layer 14, the first III-V compound layer 16, the third III-V compound layer 18, and the nitride layer 20 on the first region R1, but not limited thereto. In some embodiments, a plurality of the mesa structures described above may be formed, and an isolation structure 24 may be formed between the mesa structures for isolating the mesa structures from one another. The isolation structure 24 may include a single layer or multiple layers of insulation materials, such as silicon oxide, silicon nitride, silicon oxynitride, or other suitable insulation materials. In some embodiments, the isolation structure 24 may be formed at the first side 10A of the substrate 10 and located on the second region R2 of the substrate 10, the first region R1 may be regarded as a mesa structure region, and the second region R2 may be regarded as a non-mesa structure region accordingly, but not limited thereto.

Subsequently, a gate electrode GE, a source electrode SE, and a contact structure CS1 may be formed at the first side 10A of the substrate 10. The gate electrode GE and the source electrode SE may be formed on the first region R1 of the substrate 10, and the contact structure CS1 may be formed on the second region R2 of the substrate 10. In addition, the gate electrode GE may be formed on the nitride layer 20, and a part of the nitride layer 20 and a part of the first III-V compound layer 16 may be located between the gate electrode GE and the substrate 10 in the first direction. In some embodiments, a gate dielectric layer 22 may be formed on the nitride layer 20 before the step of forming the gate electrode GE and the step of forming the source electrode SE, and the gate electrode GE may be formed on the gate dielectric layer 22. In some embodiments, the source electrode SE may penetrate the gate dielectric layer 22 and the nitride layer 20 in the first direction D1 and be partially located in the first III-V compound layer 16. The source electrode SE may be located at two sides of the gate electrode GE in a horizontal direction (such as a second direction D2 shown in FIG. 1) and/or surround the gate electrode GE in the horizontal direction, and a part of the first III-V compound layer 16 may be located between the source electrode SE and the substrate 10 in the first direction D1, but not limited thereto. In addition, the contact structure CS1 may be formed on the second region R2 of the substrate 10, and at least a part of the contact structure CS1 may be formed in the isolation structure 24. The gate electrode GE, the source electrode SE, and the contact structure CS1 may respectively include conductive metal materials or other suitable conductive materials. The conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of the above-mentioned materials, or an alloy of the above-mentioned materials, but not limited thereto. In some embodiments, the source electrode and the contact structure CS1 may be formed concurrently by the same process, or the gate electrode GE and the contact structure CS1 may be formed concurrently by the same process, but not limited thereto. In some embodiments, the gate electrode GE, the source electrode SE, and the contact structure CS1 may be formed respectively by different processes.

As shown in FIG. 1 and FIG. 2, in some embodiments, after the steps of forming the gate electrode GE, the source electrode SE, and the contact structure CS1, the substrate 10 may be overturned for making the second side 10B of the substrate 10 facing upwards, and the substrate 10 may be bonded with a support substrate 28. In some embodiments, a dielectric layer 26 may be formed covering the gate electrode GE, the source electrode SE, and the contact structure CS1, and the support substrate 28 may then be bonded with the dielectric layer 26 adhesively. In some embodiments, the dielectric layer 26 may be an adhesive dielectric material, or another adhesive layer (not shown) may be used to combine the dielectric layer 26 with the support substrate 28. The support substrate 28 may include a glass support substrate, a plastic support substrate, a ceramic support substrate, a sapphire support substrate, a stainless steel support substrate, or a support substrate formed by other suitable materials. Subsequently, a thinning process 90 may be performed to the substrate 10 from the second side 10B of the substrate 10. The thinning process 90 may include but is not limited to a dray etching process, a wet etching process, a polishing process (such as a chemical mechanical polishing process), or other suitable approaches capable of reducing the thickness of the substrate 10 for being beneficial for performing the process of forming trenches subsequently.

As shown in FIG. 2 and FIG. 3, after the thinning process 90, the drain trench TR1 and the contact trench TR2 may be formed concurrently by the same process for process simplification. In other words, the thinning process 90 may be performed to the substrate 10 from the second side 10B of the substrate 10 before the step of forming the drain trench TR1 and the contact trench TR2. In some embodiments, the process of forming the drain trench TR1 and the contact trench TR2 may include but is not limited to forming a patterned mask (such as patterned photoresist or other suitable patterned mask materials, not shown) at the second side 10B of the substrate 10 and performing an etching process (such as a dry etching process and/or a wet etching process) for forming the drain trench TR1 and the contact trench TR2 concurrently. In some embodiments, the drain trench TR1 may extend from the second side 10B of the substrate 10 toward the first side 10A of the substrate 10, penetrate the substrate 10 and the buffer layer 12, and be partially formed in the second III-V compound layer 14, and the contact trench TR2 may extend from the second side 10B of the substrate 10 toward the first side 10A of the substrate 10, penetrate the substrate 10 and the buffer layer 12, be partially disposed in the isolation structure 24, and expose a part of the contact structure CS1, but not limited thereto. In other words, the isolation structure 24 may be formed before the step of forming the contact trench TR2, but not limited thereto. In addition, the drain trench TR1 and the contact trench TR2 formed concurrently by the same process may have different depths when the stacked layers corresponding to the drain trench TR1 are different from the stacked layers corresponding to the contact trench TR2, but not limited thereto.

As shown in FIG. 3 and FIG. 4, the drain electrode is formed in the drain trench TR1 and the back contact structure CS2 is formed in the contact trench TR2. The back contact structure CS2 may contact and be electrically connected to the contact structure CS1, and the back contact structure CS2 is electrically separated from the drain electrode DE. It is worth noting that, before the step of forming the drain electrode and the back contact structure CS2, a wet cleaning process, a plasma cleaning process and/or other suitable cleaning processes may be performed to the drain trench TR1 and the contact trench TR2 for removing etching byproducts and/or micro particles generated by the step of forming the drain trench TR1 and the contact trench TR2. Additionally, the drain electrode DE and the back contact structure CS2 may respectively include conductive metal materials or other suitable conductive materials. The conductive metal materials mentioned above may include gold, tungsten, cobalt, nickel, titanium, molybdenum, copper, aluminum, tantalum, palladium, platinum, a compound of the above-mentioned materials, a stack layer of the above-mentioned materials, or an alloy of the above-mentioned materials, but not limited thereto. In some embodiments, the drain electrode DE and the back contact structure CS2 may be formed concurrently by the same process for process simplification, and the material composition of the back contact structure CS2 may be identical to the material composition of the drain electrode DE accordingly, but not limited thereto. For example, a first conductive layer 30 may be formed after the step of forming the drain trench TR1 and the contact trench TR2. The first conductive layer 30 may be partially formed in the drain trench TR1 and partially formed in the contact trench TR2, and the drain electrode DE and the back contact structure CS2 may be formed concurrently by performing a patterning process to the first conductive layer 30. In some embodiments, the drain electrode DE and the back contact structure CS2 may be formed respectively by different conductive materials and/or different manufacturing processes according to some considerations.

Subsequently, after the step of forming the drain electrode DE and the back contact structure CS2, the support substrate 28 may be removed for forming the semiconductor device 101 shown in FIG. 5. As shown in FIGS. 1-5, in some embodiments, the gate electrode GE and the contact structure CS1 may be formed before the step of forming the drain trench TR1 and the contact trench TR2, but the present invention is not limited to this. Additionally, in some embodiments, the contact structure CS1 may be electrically connected to the source electrode SE or the gate electrode GE via other conductive structures (not shown) located at the first side 10A of the substrate 10, or the source electrode SE and/or the gate electrode GE may be directly connected with the contact structure CS1 and be electrically connected to the back contact structure CS2 by the contact structure CS1, but not limited thereto. In some embodiments, the semiconductor device 101 may include a plurality of the contact structures CS1 and corresponding back contact structures CS2, a wire bonding process may be performed at the second side 10B of the substrate 10 for forming electrical connection with the drain electrode DE, the source electrode SE, and the gate electrode GE, and the purposes of simplifying the related wiring layout design and/or simplifying the related manufacturing processes may be achieved accordingly. Additionally, in some embodiments, the third III-V compound layer 18 may be regarded as a current blocking layer, the first portion P1 of the first III-V compound layer 16 may be regarded as a drift region, two-dimensional electron gas (2DEG) may be localized in the third portion P3 of the first III-V compound layer 16 and at a side adjacent to the nitride layer 20, and a part of the semiconductor device 101 in the first region R1 may be regarded as a current-aperture vertical electron transistor (CAVET), but not limited thereto. It is worth noting that the structure of the semiconductor device in the present invention is not limited to the condition shown in FIG. 1, and other types of semiconductor manufacturing method and/or other types of semiconductor structures including the first III-V compound layer 16 located at the front side of the substrate 10 (such as the first side 10A) may be combined with the drain trench TR1 and the contact trench TR2 penetrating the substrate 10 from the back side of the substrate 10 (such as the second side 10B) in the present invention.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
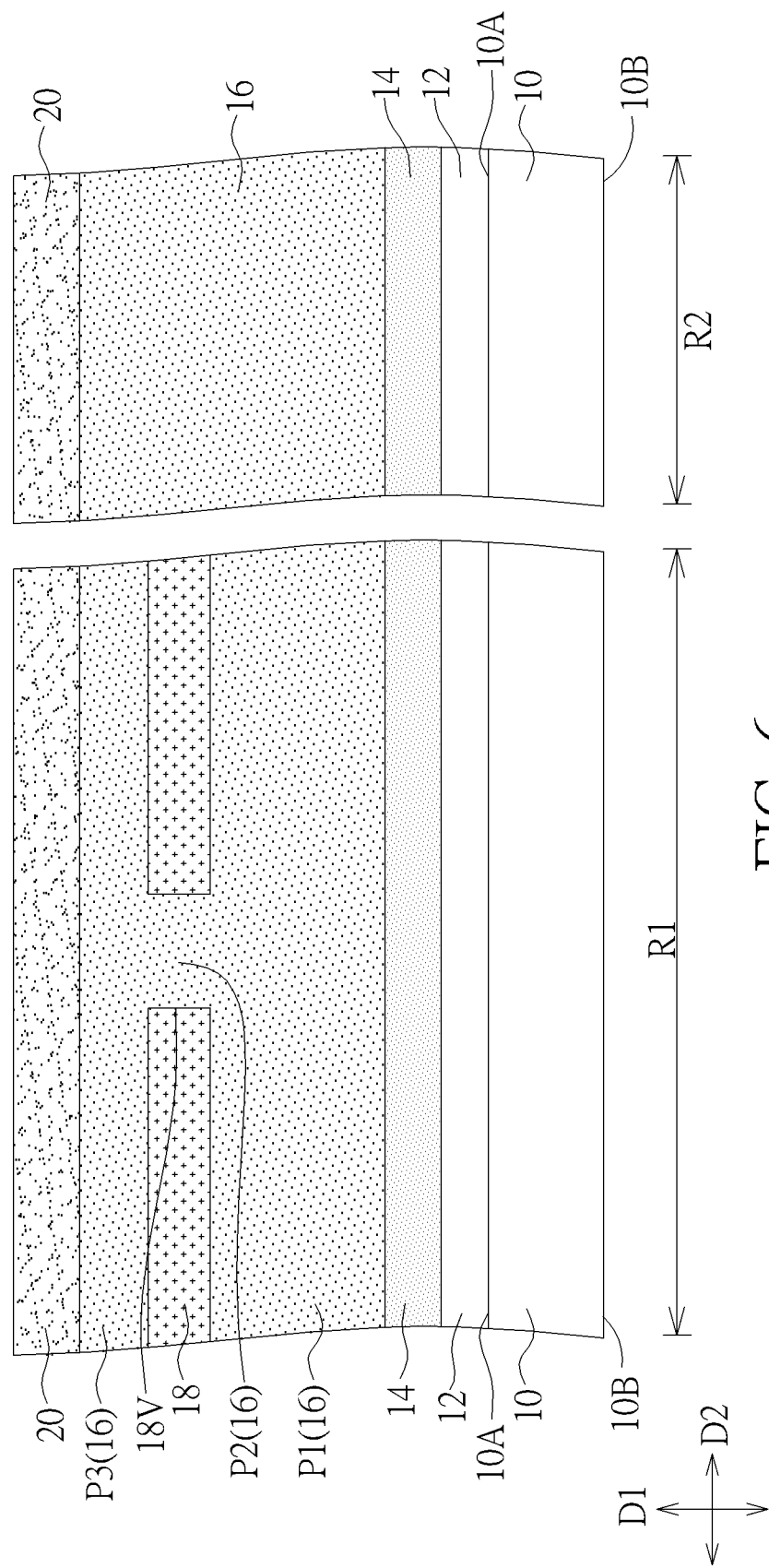
Figure 7:
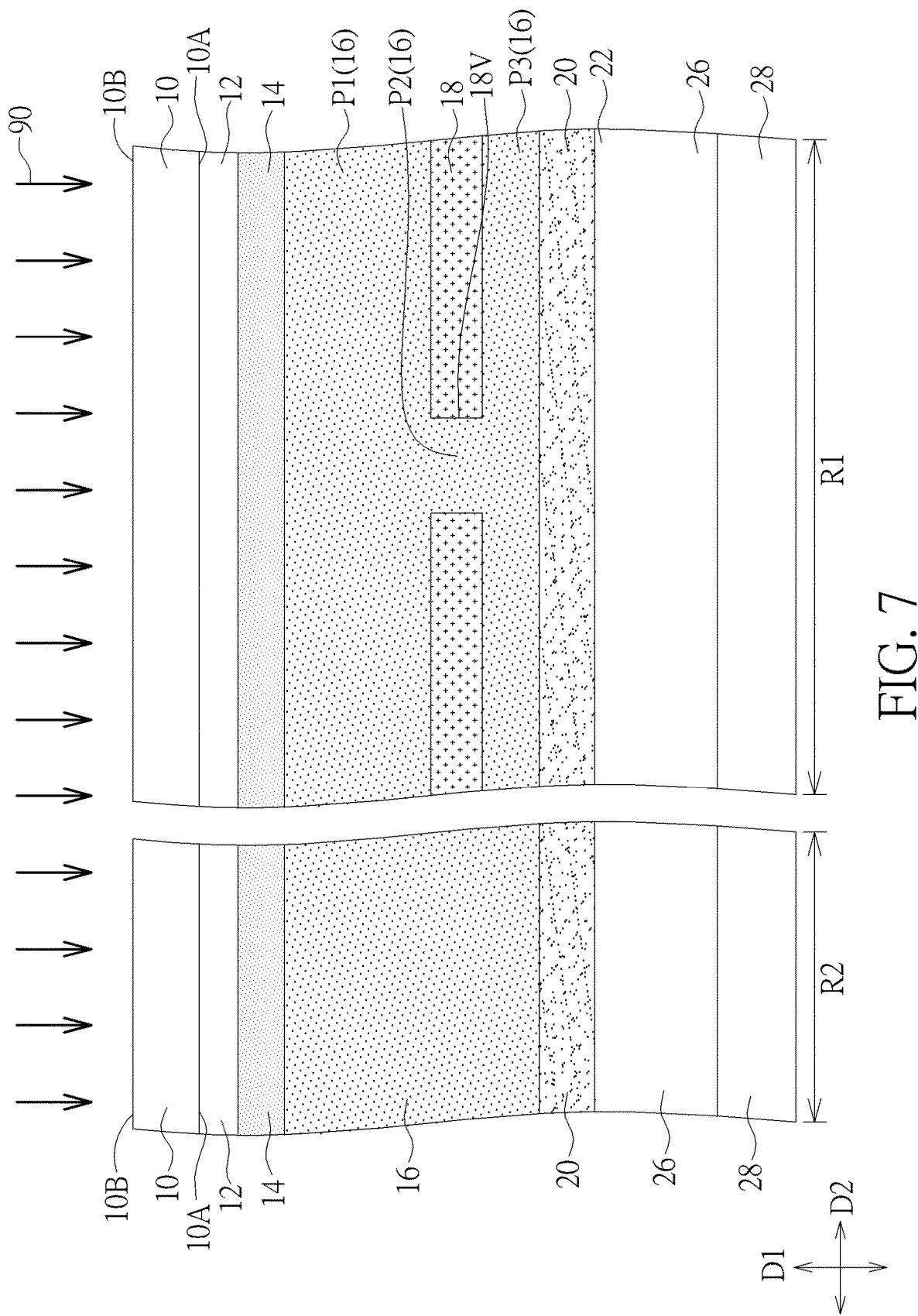
Figure 8:
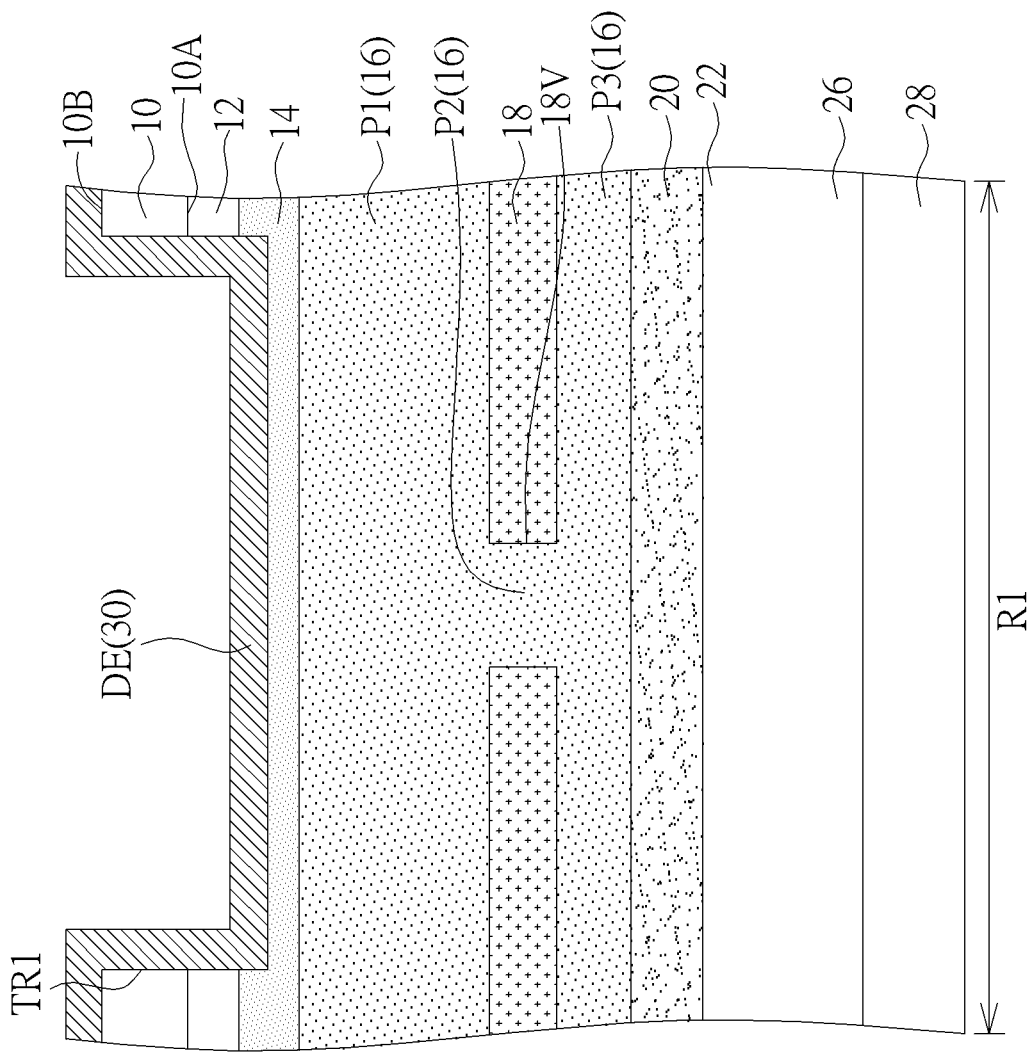
Figure 9:
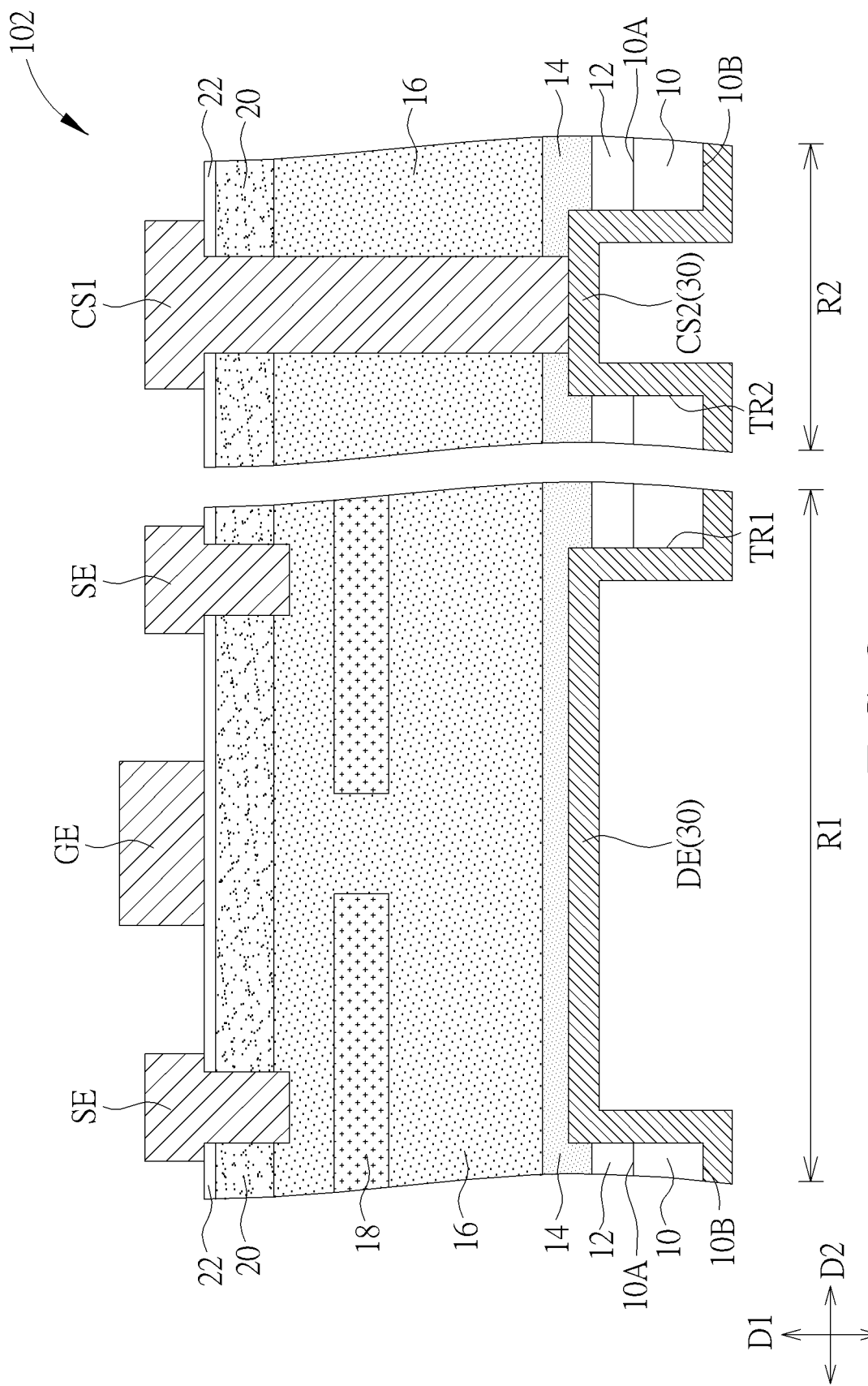

Please refer to FIGS. 6-9. FIGS. 6-9 are schematic drawings illustrating a manufacturing method of a semiconductor device 102 according to a second embodiment of the present invention. As shown in FIG. 6 and FIG. 7, after the steps of forming the buffer layer 12, the second III-V compound layer 14, the first III-V compound layer 16, and the nitride layer 20, the substrate 10 may be overturned for making the second side 10B of the substrate 10 facing upwards, and the substrate 10 may be bonded with the support substrate 28. In some embodiments, the dielectric layer 26 may be adhesive for being bonded with the support layer 28, but not limited thereto. Subsequently, the thinning process 90 may be performed to the substrate 10 from the second side 10B of the substrate 10 for reducing the thickness of the substrate 10. As shown in FIG. 7 and FIG. 8, after the thinning process 90, the drain trench TR1 and the contact trench TR2 may be formed concurrently by the same process, and the drain electrode DE and the back contact structure CS2 may be formed in the drain trench TR1 and the contact trench TR2 respectively. In some embodiments, the contact trench TR2 may penetrate the substrate 10 and the buffer layer 12 and be partially disposed in the second III-V compound layer 14. In some embodiments, before the thinning process 90, the nitride layer 20, the first III-V compound layer 16, the second III-V compound layer 14, and a part of the buffer layer 12 on the second region R2 may be removed and the isolation structure 24 shown in FIG. 2 described above may be formed on the second region R2 according to some considerations, but not limited thereto. Subsequently, as shown in FIG. 8 and FIG. 9, after the steps of forming the drain electrode DE and the back contact structure CS2, the support substrate 28 and the dielectric layer 26 may be removed, and the gate dielectric layer 22, the gate electrode GE, the source electrode SE, and the contact structure CS1 may be formed at the first side 10A of the substrate 10. In some embodiments, the substrate 10 having the drain electrode DE and the back contact structure CS2 formed thereon may be bonded with another support substrate (not shown) before the steps of forming the gate dielectric layer 22, the gate electrode GE, the source electrode SE, and the contact structure CS1, but not limited thereto. In addition, the contact structure CS1 may penetrate the nitride layer 20, the first III-V compound layer 16, and a part of the second III-V compound layer 14 for contacting and being electrically connected to the back contact structure CS2. In the manufacturing method of this embodiment, the gate dielectric layer 22, the gate electrode GE, the source electrode SE, and the contact structure CS1 may be formed after the steps of forming the drain trench TR1, the contact trench TR2, the drain electrode DE, and the back contact structure CS2, the negative influence of the related processes for forming the drain trench TR1, the contact trench TR2, the drain electrode DE, and/or the back contact structure CS2 on the gate dielectric layer 22 may be avoided accordingly, and the electrical performance of the semiconductor device 102 may be enhanced.

Figure 10:
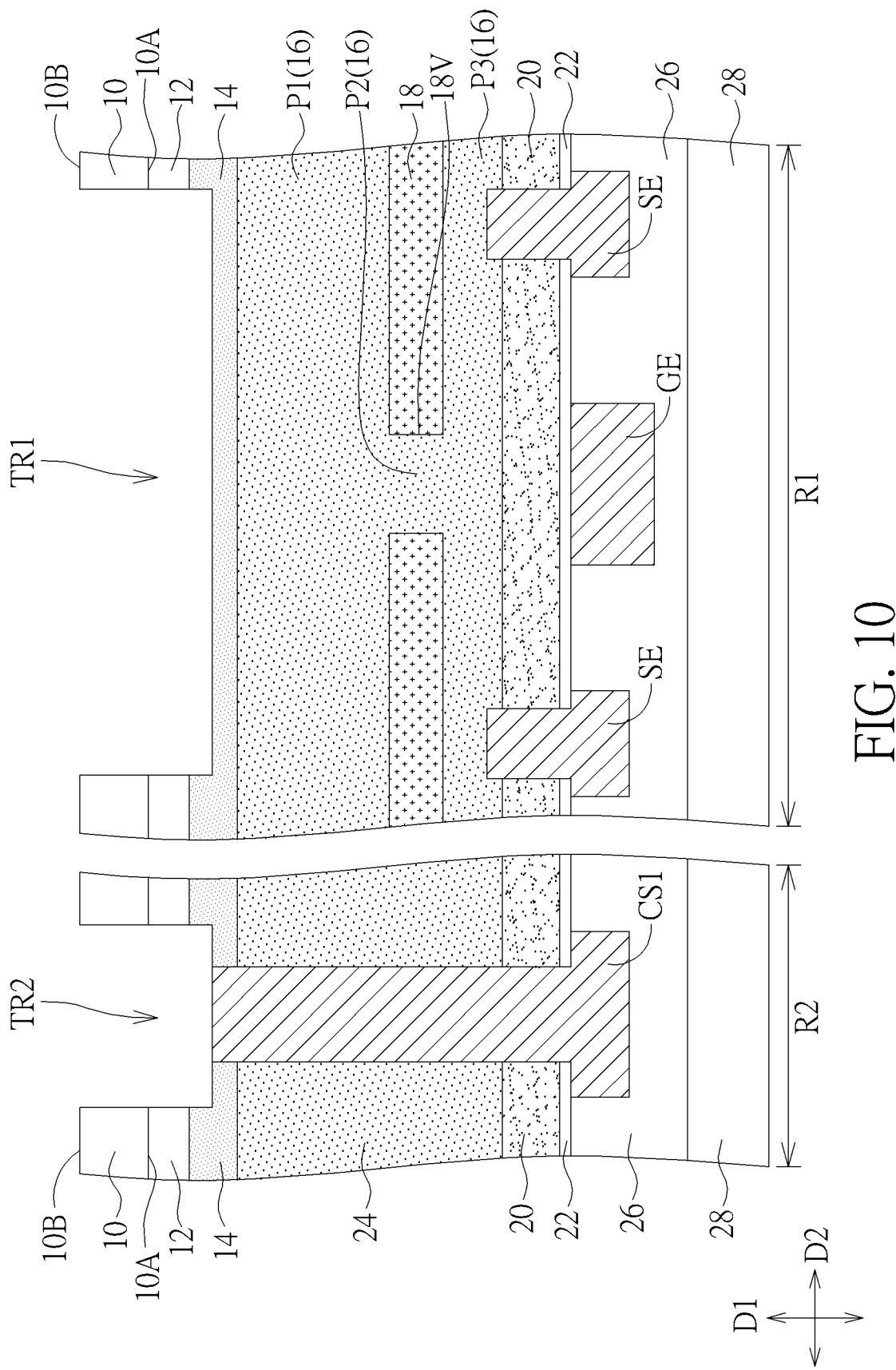
FIG. 10 is a schematic drawing illustrating a manufacturing method of a semiconductor device according to a third embodiment of the present invention.

Please refer to FIG. 10. FIG. 10 is a schematic drawing illustrating a manufacturing method of a semiconductor device according to a third embodiment of the present invention. As shown in FIG. 10, the difference between the manufacturing method in this embodiment and that in the first embodiment described above is that, the contact structure CS1 in this embodiment may penetrate the nitride layer 20, the first III-V compound layer 16, and a part of the second III-V compound layer 14 in the first direction D1, and the drain trench TR1 and the contact trench TR2 may be formed after the steps of forming the contact structure CS1, the gate electrode GE, and the source electrode SE.

Figure 11:
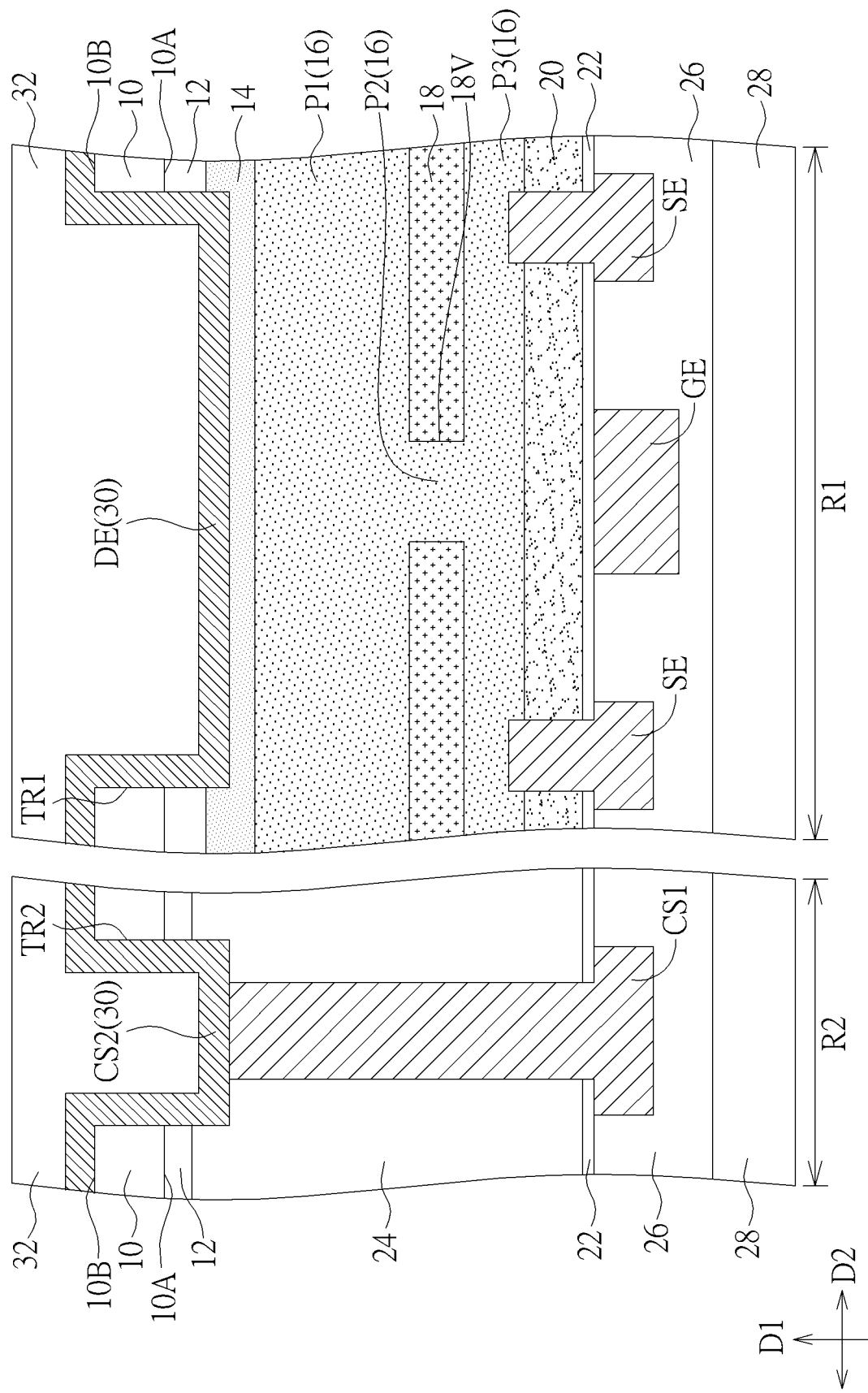
FIG. 11 is a schematic drawing illustrating a manufacturing method of a semiconductor device according to a fourth embodiment of the present invention.

Please refer to FIG. 11. FIG. 11 is a schematic drawing illustrating a manufacturing method of a semiconductor device according to a fourth embodiment of the present invention. As shown in FIG. 11, the difference between the manufacturing method in this embodiment and that in the first embodiment described above is that, the manufacturing method in this embodiment may further include forming an insulation layer 32 at the second side 10B of the substrate 10 after forming the drain electrode DE and forming the back contact structure CS2, and the insulation layer 32 covers the drain electrode DE and the back contact structure CS2 for forming a protection effect. The insulation layer 32 may include a single layer or multiple layers of insulation materials, such as an inorganic insulation material (such as silicon oxide, silicon nitride, or silicon oxynitride), an organic insulation material (such as acrylic resin), or other suitable insulation materials. In some embodiments, the insulation layer 32 may be partially formed in the drain trench TR1 and the contact trench TR2. In some embodiments, the drain trench TR1 may be filled with the insulation layer 32 and the drain electrode DE, and the contact trench TR2 may be filled with the insulation layer 32 and the back contact structure CS2, but not limited thereto. Additionally, in some embodiments, a planarization process may be performed after the step of forming the insulation layer 32 for planarizing the surface of the insulation layer 32. The planarization process described above may include a dry etching process, a wet etching process, a polishing process (such as a chemical mechanical polishing process), or other suitable planarization approaches. In addition, the insulation layer 32 in this embodiment may be applied to other embodiments of the present invention according to some considerations.

Figure 12:
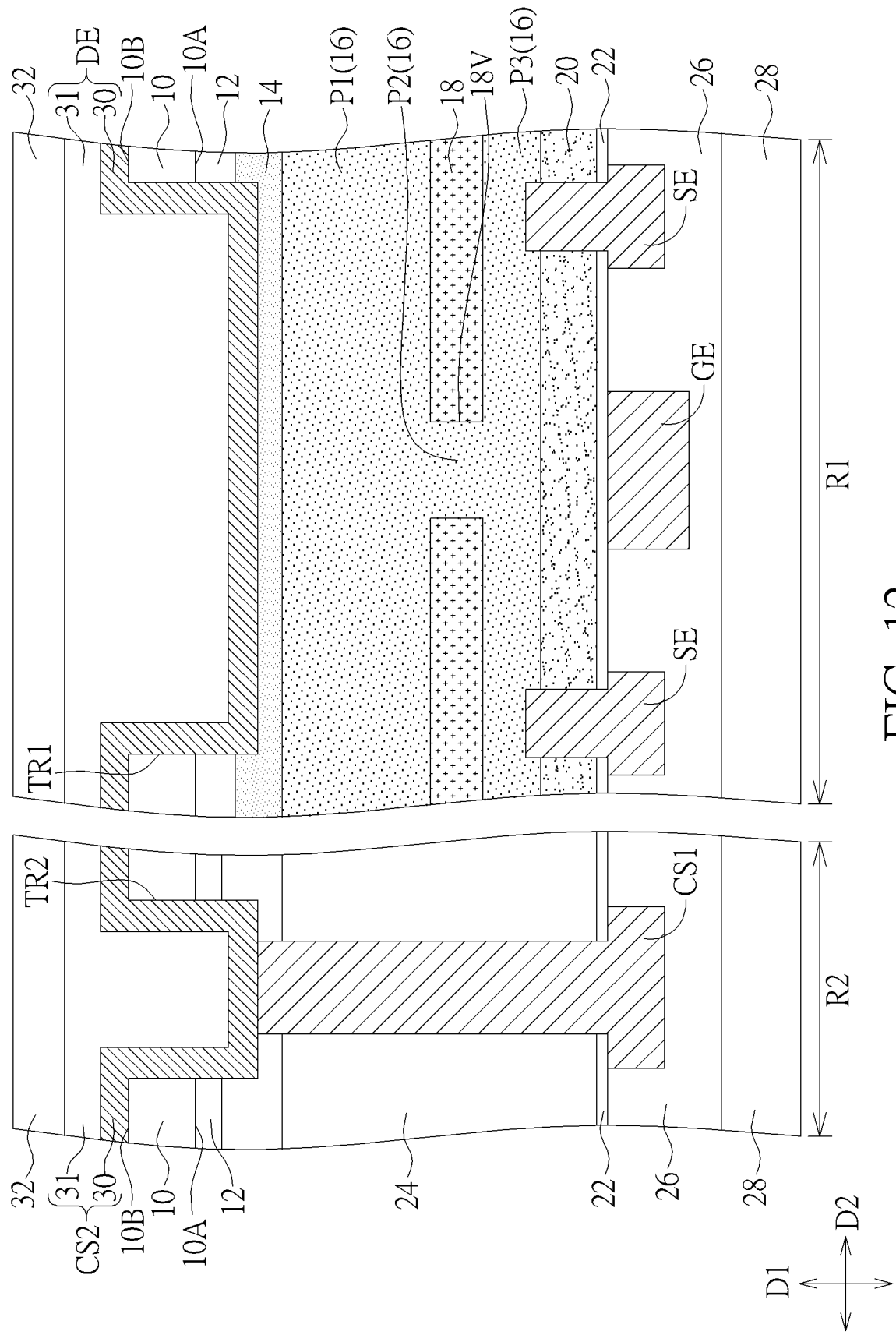
FIG. 12 is a schematic drawing illustrating a manufacturing method of a semiconductor device according to a fifth embodiment of the present invention.

Please refer to FIG. 12. FIG. 12 is a schematic drawing illustrating a manufacturing method of a semiconductor device according to a fifth embodiment of the present invention. As shown in FIG. 12, the difference between the manufacturing method in this embodiment and that in the first embodiment described above is that the drain electrode DE and the back contact structure CS2 in this embodiment may include the first conductive layer 30 and a second conducive layer 31. The first conductive layer 30 may be formed conformally on the drain trench TR1, the contact trench TR2, and the substrate 10, and the second conductive layer 31 may cover the first conductive layer 30. The material of the second conductive layer 31 may be different from the material of the first conductive layer 30. For example, the first conductive layer 30 may include titanium nitride, tantalum nitride, or other suitable conductive materials with better barrier performance, and the second conductive layer 31 may include conductive materials having relatively lower resistivity, such as copper, aluminum, and tungsten, but not limited thereto. In this embodiment, the drain electrode DE and the back contact structure CS2 may be formed concurrently by performing a patterning process to the first conductive layer 30 and the second conductive layer 31. In some embodiments, the drain trench TR1 may be filled with the drain electrode DE, and the contact trench TR2 may be filled with the back contact structure CS2, but not limited thereto.

In some embodiments, a planarization process may be performed after the step of forming the second conductive layer 31 for planarizing the surface of the second conductive layer 31. The planarization process described above may include a dry etching process, a wet etching process, a polishing process (such as a chemical mechanical polishing process), or other suitable planarization approaches. In addition, the insulation layer 32 may be formed on the second conductive layer 31, and the insulation layer 32 may cover the drain electrode DE and the back contact structure CS2 for providing a protection effect. The approach of forming the drain electrode DE and the back contact structure CS2 by the first conductive layer 30 and the second conductive layer 31 in this embodiment may be applied to other embodiments of the present invention according to some considerations. Additionally, in some embodiments, the drain electrode DE and the back contact structure CS2 may be formed by different materials respectively according to some considerations while the drain trench TR1 may be filled with the drain electrode DE, and the contact trench TR2 may be filled with the back contact structure CS2.

To summarize the above descriptions, according to the semiconductor device in the present invention, the drain trench and the contact trench may be formed at the back side of the substrate, the drain electrode may be formed in the drain trench, and the back contact structure may be formed in the contact trench for enhancing the distribution density of the transistors and/or simplifying related wiring layout design and related processes. In addition, the drain trench and the contact trench may be formed concurrently by the same process for process simplification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:

providing a substrate having a first side and a second side opposite to the first side;

forming a first III-V compound layer at the first side of the substrate;

forming a drain trench and a contact trench at the second side of the substrate, wherein the drain trench extends from the second side of the substrate toward the first side of the substrate and penetrates the substrate, the contact trench extends from the second side of the substrate toward the first side of the substrate and penetrates the substrate, and the drain trench and the contact trench are formed concurrently by a same process;

forming a drain electrode in the drain trench;

forming a back contact structure in the contact trench;

forming a buffer layer at the first side of the substrate, wherein at least a part of the buffer layer is located between the substrate and the first III-V compound layer; and forming a second III-V compound layer on the buffer layer, wherein the second III-V compound layer is located between the first III-V compound layer and the buffer layer, the first III-V compound layer comprises an n-type lightly doped gallium nitride layer, and the second III-V compound layer comprises an n-type heavily doped gallium nitride layer.

2. The manufacturing method of the semiconductor device according to claim 1, wherein the back contact structure is electrically separated from the drain electrode.

3. The manufacturing method of the semiconductor device according to claim 1, further comprising:
performing a thinning process to the substrate from the second side of the substrate before forming the drain trench and the contact trench.

4. The manufacturing method of the semiconductor device according to claim 1, wherein the drain trench further penetrates the buffer layer and is partially disposed in the second III-V compound layer.

5. The manufacturing method of the semiconductor device according to claim 1, wherein the contact trench further penetrates the buffer layer and is partially disposed in the second III-V compound layer.

6. The manufacturing method of the semiconductor device according to claim 1, wherein the drain trench is filled with the drain electrode, and the contact trench is filled with the back contact structure.

7. The manufacturing method of the semiconductor device according to claim 1, wherein a material composition of the back contact structure is identical to a material composition of the drain electrode.

8. The manufacturing method of the semiconductor device according to claim 1, further comprising:
forming a source electrode at the first side of the substrate, wherein a part of the first III-V compound layer is located between the source electrode and the substrate.

9. The manufacturing method of the semiconductor device according to claim 1, wherein the substrate comprises a silicon substrate.

10. The manufacturing method of the semiconductor device according to claim 1, further comprising:
forming a gate electrode at the first side of the substrate; wherein a part of the first III-V compound layer is located between the gate electrode and the substrate; and forming a contact structure at the first side of the substrate, wherein the contact structure is electrically connected to the back contact structure.

11. The manufacturing method of the semiconductor device according to claim 10, wherein the gate electrode and the contact structure are formed before forming the drain trench and the contact trench.

12. The manufacturing method of the semiconductor device according to claim 10, wherein the gate electrode and the contact structure are formed after forming the drain electrode and forming the back contact structure.

13. The manufacturing method of the semiconductor device according to claim 1, further comprising:
forming an isolation structure at the first side of the substrate, wherein a part of the contact trench is further formed in the isolation structure.

14. The manufacturing method of the semiconductor device according to claim 13, further comprising:
forming a gate electrode at the first side of the substrate; wherein a part of the first III-V compound layer is located between the gate electrode and the substrate; and forming a contact structure at the first side of the substrate, wherein at least a part of the contact structure is formed in the isolation structure, and the contact structure is electrically connected to the back contact structure.

15. The manufacturing method of the semiconductor device according to claim 13, wherein the isolation structure is formed before forming the contact trench.

16. The manufacturing method of the semiconductor device according to claim 1, further comprising:
forming an insulation layer at the second side of the substrate after forming the drain electrode and forming the back contact structure, wherein the insulation layer covers the drain electrode and the back contact structure.

17. The manufacturing method of the semiconductor device according to claim 16, wherein the insulation layer is partially formed in the drain trench and the contact trench.

18. The manufacturing method of the semiconductor device according to claim 17, wherein the drain trench is filled with the insulation layer and the drain electrode, and the contact trench is filled with the insulation layer and the back contact structure.

* * * * *